United States Patent
Estakhri

(10) Patent No.: US 7,277,011 B2
(45) Date of Patent: Oct. 2, 2007

(54) REMOVABLE MEMORY MEDIA WITH INTEGRAL INDICATOR LIGHT

(75) Inventor: Petro Estakhri, Pleasanton, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/371,861

(22) Filed: Feb. 21, 2003

(65) Prior Publication Data

US 2003/0161199 A1    Aug. 28, 2003

Related U.S. Application Data

(60) Provisional application No. 60/359,468, filed on Feb. 22, 2002.

(51) Int. Cl.
*G08B 21/00* (2006.01)

(52) U.S. Cl. ............ 340/540; 365/228; 396/310; 396/321

(58) Field of Classification Search ............ 340/500; 369/22, 53.1, 53.31, 53, 44, 70; 365/185.33, 365/230.03, 221, 228 X; 371/10.2, 21.1; 711/163, 164, 103; 348/231.1, 231.3; 386/117, 386/107, 104; 395/430; 396/281, 310 X, 396/321 X See application file for complete search history.

(56) References Cited

U.S. PATENT DOCUMENTS

| | | | |
|---|---|---|---|
| 4,979,173 A | 12/1990 | Geldman et al. | 371/39.1 |
| 5,140,595 A | 8/1992 | Geldman et al. | 371/39.1 |
| 5,317,505 A | 5/1994 | Karabed et al. | 364/410 |
| 5,388,083 A | 2/1995 | Assar et al. | 365/218 |
| 5,455,721 A | 10/1995 | Nemazie et al. | 360/51 |
| 5,465,235 A | 11/1995 | Miyamoto | 365/203 |
| 5,477,103 A | 12/1995 | Romano et al. | 318/601 |
| 5,479,638 A | 12/1995 | Assar et al. | 395/430 |
| 5,485,595 A | 1/1996 | Assar et al. | 395/430 |
| 5,523,724 A | 6/1996 | Assar et al. | 331/1 A |
| 5,523,979 A | 6/1996 | Nemazie | 365/230.05 |
| 5,544,356 A | 8/1996 | Robinson et al. | 395/600 |
| 5,576,910 A | 11/1996 | Romano et al. | 360/77.08 |
| 5,586,306 A | 12/1996 | Romano et al. | 395/500 |
| 5,592,669 A | 1/1997 | Robinson et al. | 395/622 |

(Continued)

FOREIGN PATENT DOCUMENTS

JP    5-282883    10/1993

(Continued)

*Primary Examiner*—Brent A. Swarthout
(74) *Attorney, Agent, or Firm*—Leffert Jay & Polglaze, P.A.

(57) ABSTRACT

A flash memory module includes an integral indicator light. The module alternatively includes a plurality electrical contacts which electrically interface to a host digital device. The module includes a plurality of flash memory cells. The cells are controlled by an integral controller. The indicator light is controlled by the controller. The indicator light indicates whether the flash memory module is being accessed. Alternatively, the indicator light indicates that the flash memory module should be replaced. A housing for the module is preferably light transmissive material, and preferably a transparent plastic. A proximal end of the module includes the electrical contacts and is inserted into the host. The indicator light is preferably a surface mount LED and is positioned adjacent the distal end of the flash memory module to be seen through the transparent plastic. Alternatively, the controller generates an electronic signal which is coupled to the host.

9 Claims, 3 Drawing Sheets

U.S. PATENT DOCUMENTS

| | | | |
|---|---|---|---|
| 5,596,526 A | 1/1997 | Assar et al. | 365/185.17 |
| 5,606,660 A | 2/1997 | Estakhri et al. | 395/183.14 |
| 5,630,093 A * | 5/1997 | Holzhammer et al. | 711/115 |
| 5,696,775 A | 12/1997 | Nemazie et al. | 371/51.1 |
| 5,701,492 A | 12/1997 | Wadsworth et al. | 395/712 |
| 5,715,423 A | 2/1998 | Levy | 395/430 |
| 5,740,358 A | 4/1998 | Geldman et al. | 395/184.01 |
| 5,768,043 A | 6/1998 | Nemazie et al. | 360/77.08 |
| 5,768,162 A | 6/1998 | Rupp et al. | 364/579 |
| 5,798,961 A | 8/1998 | Heyden et al. | 365/52 |
| 5,818,029 A | 10/1998 | Thomson | 235/486 |
| 5,818,350 A | 10/1998 | Estakhri et al. | 340/825.52 |
| 5,818,781 A | 10/1998 | Estakhri et al. | 365/226 |
| 5,835,935 A | 11/1998 | Estakhri et al. | 711/103 |
| 5,838,614 A | 11/1998 | Estakhri et al. | 365/185.11 |
| 5,845,313 A | 12/1998 | Estakhri et al. | 711/103 |
| 5,848,438 A | 12/1998 | Nemazie et al. | 711/201 |
| 5,864,568 A | 1/1999 | Nemazie | 371/40.14 |
| 5,877,975 A | 3/1999 | Jigour et al. | 365/52 |
| 5,889,959 A * | 3/1999 | Whittaker et al. | 709/232 |
| 5,907,856 A | 5/1999 | Estakhri et al. | 711/103 |
| 5,909,596 A | 6/1999 | Mizuta | 395/883 |
| 5,920,731 A | 7/1999 | Pletl et al. | 395/834 |
| 5,922,055 A | 7/1999 | Shahar et al. | 710/16 |
| 5,924,113 A | 7/1999 | Estakhri et al. | 711/103 |
| 5,928,347 A | 7/1999 | Jones | 710/129 |
| 5,928,370 A | 7/1999 | Asnaashari | 714/48 |
| 5,930,815 A | 7/1999 | Estakhri et al. | 711/103 |
| 5,953,737 A | 9/1999 | Estakhri et al. | 711/103 |
| 6,018,265 A | 1/2000 | Keshtbod | 327/540 |
| 6,025,966 A | 2/2000 | Nemazie et al. | 360/53 |
| 6,026,293 A | 2/2000 | Osborn | 455/411 |
| 6,034,897 A | 3/2000 | Estakhri et al. | 365/185.33 |
| 6,040,997 A | 3/2000 | Estakhri | 365/185.33 |
| 6,041,001 A | 3/2000 | Estakhri | 365/200 |
| 6,076,137 A | 6/2000 | Asnaashari | 711/103 |
| 6,081,878 A | 6/2000 | Estakhri et al. | 711/168 |
| 6,084,483 A | 7/2000 | Keshtbod | 331/57 |
| 6,115,785 A | 9/2000 | Estakhri et al. | 711/103 |
| 6,122,195 A | 9/2000 | Estakhri et al. | 365/185.11 |
| 6,125,409 A | 9/2000 | Le Roux | 710/22 |
| 6,125,435 A | 9/2000 | Estakhri et al. | 711/201 |
| 6,128,695 A | 10/2000 | Estakhri et al. | 711/103 |
| 6,134,151 A | 10/2000 | Estakhri et al. | 365/185.33 |
| 6,138,180 A | 10/2000 | Zegelin | 710/11 |
| 6,141,249 A | 10/2000 | Estakhri et al. | 365/185.11 |
| 6,144,607 A | 11/2000 | Sassa | 365/230.03 |
| 6,145,051 A | 11/2000 | Estakhri et al. | 711/103 |
| 6,151,247 A | 11/2000 | Estakhri et al. | 365/185.11 |
| 6,157,559 A * | 12/2000 | Yoo | 365/52 |
| 6,172,906 B1 | 1/2001 | Estakhri et al. | 365/185.11 |
| 6,177,958 B1 | 1/2001 | Anderson | 348/362 |
| 6,182,162 B1 | 1/2001 | Estakhri et al. | 710/11 |
| 6,202,138 B1 | 3/2001 | Estakhri et al. | 711/168 |
| 6,223,293 B1 | 4/2001 | Foster et al. | 713/300 |
| 6,223,308 B1 | 4/2001 | Estakhri et al. | 714/42 |
| 6,230,234 B1 | 5/2001 | Estakhri et al. | 711/103 |
| 6,238,111 B1 | 5/2001 | Silverbrook | 400/70 |
| 6,240,482 B1 | 5/2001 | Gates et al. | 710/130 |
| 6,262,918 B1 | 7/2001 | Estakhri et al. | 365/185.33 |
| 6,282,624 B1 | 8/2001 | Kimura et al. | 711/702 |
| 6,314,480 B1 | 11/2001 | Nemazie et al. | 710/74 |
| 6,327,639 B1 | 12/2001 | Asnaashari | 711/103 |
| 6,339,831 B1 | 1/2002 | Sugawara et al. | 714/3 |
| 6,356,984 B1 | 3/2002 | Day et al. | 711/147 |
| 6,360,220 B1 | 3/2002 | Forin | 707/8 |
| 6,374,337 B1 | 4/2002 | Estakhri | 711/169 |
| 6,385,667 B1 | 5/2002 | Estakhri et al. | 710/8 |
| 6,389,500 B1 | 5/2002 | Lin | 710/302 |
| 6,393,513 B2 | 5/2002 | Estakhri et al. | 711/103 |
| 6,397,314 B1 | 5/2002 | Estakhri et al. | 711/168 |
| 6,404,246 B1 | 6/2002 | Estakhri et al. | 327/156 |
| 6,411,546 B1 | 6/2002 | Estakhri et al. | 365/185.11 |
| 6,426,893 B1 | 7/2002 | Conley et al. | 365/185.11 |
| 6,434,648 B1 | 8/2002 | Assour et al. | 710/102 |
| 6,446,177 B1 | 9/2002 | Tanaka et al. | 711/163 |
| 6,477,043 B2 | 11/2002 | McKnight | 361/685 |
| 6,484,216 B1 | 11/2002 | Zegelin | 710/11 |
| 6,490,649 B2 | 12/2002 | Sinclair | 711/103 |
| 6,564,056 B1 | 5/2003 | Fitzgerald | 455/435 |
| 6,587,382 B1 | 7/2003 | Estakhri et al. | 365/185.29 |
| 6,603,509 B1 * | 8/2003 | Haruki | 348/231.1 |
| 6,625,713 B2 | 9/2003 | Iida et al. | 711/206 |
| 6,658,202 B1 * | 12/2003 | Battaglia et al. | 386/117 |
| 6,757,783 B2 * | 6/2004 | Koh | 711/115 |
| 6,757,842 B2 | 6/2004 | Harari et al. | 714/7 |
| 6,772,274 B1 | 8/2004 | Estakhri | 711/103 |
| 6,792,501 B2 * | 9/2004 | Chen et al. | 711/103 |
| 6,987,927 B1 * | 1/2006 | Battaglia et al. | 386/117 |

FOREIGN PATENT DOCUMENTS

| | | |
|---|---|---|
| JP | 7-122092 | 5/1995 |
| JP | 2000181805 * | 6/2000 |
| JP | 2001266098 * | 9/2001 |
| WO | WO 02023357 * | 3/2007 |

* cited by examiner

REMOVABLE MEMORY MEDIA WITH INTEGRAL INDICATOR LIGHT

CROSS REFERENCE TO RELATED APPLICATIONS

This application claims priority of and incorporates by reference U.S. Provisional Patent Application Ser. No. 60/359,468 filed Feb. 22, 2002, and entitled Removable Memory Media With Integral Indicator Light.

FIELD OF THE INVENTION

This invention relates to the field of removable memory media. More particularly, this invention relates to the removable memory that includes an integral indicator light to indicate that the memory is in use.

BACKGROUND OF THE INVENTION

Removable personal mass storage memory media has been used for many years. Examples of such devices in include floppy discs, read-write CD-ROMs, and flash memory modules. It is well known that the drive and controller units that accept floppies and CD-ROMs include a controllable light that indicates whether the drive is writing to or reading from the media. The system activates the light to advise an operator that the media is being accessed so that the operator does not inadvertently remove the media during a read or write operation. It is well recognized that removing a personal mass storage memory media can interfere with a successful operation. It is further recognized that removing the media during an access can corrupt the data.

More recently, flash memory modules have gained widespread acceptance. Generally, flash memory modules are used in a host digital device that includes a display screen. Examples of such digital devices include digital cameras, personal computers, and personal digital assistants (PDAs). Unlike other personal memory mass storage memory media, flash memory has no rotating media. Thus, the system is not a 'drive', but rather an interface unit. Applications for flash memory modules do not include an indicator light. Rather, the host digital device includes an integral display module which is used to advise the operator when the flash module is being accessed. Unlike the indicators on a drives as found in floppies and CD-ROMs, these displays indicate when the CPU in the host digital device has completed its operation to read data from or write data to the flash module.

As is well known, writing data to a flash module takes a finite amount of time that is generally long when compared to writing data to conventional volatile memory, such as addressable RAM, SRAM, DRAM or to a cache. When data is being written to the flash module, often the CPU operates to write the data into the volatile memory. The memory then is transferred from the volatile memory into the flash memory under control of a flash controller mounted on the flash module. Under such a system, it is possible for the CPU to present the message to the operator that the access of the flash memory is complete, when in fact the data was transferred to the volatile memory but not from the volatile memory to the flash memory. The presents the opportunity for the operator to remove the flash module from the interface unit while the data is being transferred from the volatile memory to the flash memory. When this happens the data file is typically corrupted.

Further, unlike floppy discs and CD-ROMs, flash memory modules typically also include integral controllers as well. It is known that the life time for flash memory cells is limited. The integral controllers on flash memory modules often operate to level the wear among the plurality flash memory cells. Certain wear leveling operations include erasing deleted files, moving data and revising the FAT tables. The host digital device is not informed and has no means to learn that the integral controller is modifying data on the flash memory module. Thus, it is possible for a flash memory module to be subjected to an operation of modifying the data, when it is not possible for the host digital device to properly notify the operator and thereby prevent corrupting the data by removing the flash memory module during such an operation. Indeed, in such a circumstance, it is possible for an operator to attempt to access the flash memory module while one such internal memory access operation is occurring. If a data file is corrupted, it is possible that only that file is corrupted. It is possible that other files on the flash module are not lost. However, if the flash memory module is removed while the FAT tables are being modified, it is generally not possible to retrieve any data from the flash module. Typically, in such a circumstance, the entire flash module must be reformatted so that all the data would be permanently lost. It may be possible to use a software application such as Norton™ utility to retrieve any non-corrupted file, however, the success rate of such an operation is not satisfactory.

Additionally, because flash memory cells have a limited life time, and because it is generally not possible for a user to know how many times a particular memory cell or group of memory cells has been written, it is possible for a host system to attempt to program data to a flash cell or a plurality of flash cells that have exceeded their useful life and are no longer functional. When this occurs, the data being written can become corrupted and permanently lost. Also, the performance of a flash cell degrades as the number of program-erase cycles to that cell passes a threshold limit. For certain critical systems, such as a flash module in a flight recorder, such degradation cannot be tolerated. This problem is particularly onerous for systems where the flash module is continuously accessed, for example by a server.

Also, certain flash modules are designed to have spare blocks that are substituted for defective blocks. In such a system, as the number of spares is reduced and becomes zero, the system becomes prone to a catastrophic failure when a program-erase operation is attempted while no goods flash blocks remain.

What is needed is an indicator that indicates when a flash memory module is active. What is further needed is an indicator which indicates when a flash memory module is performing an internal memory access operation.

BRIEF SUMMARY OF THE INVENTION

The present invention is for a flash memory module that includes an integral indicator light. The flash memory module includes a plurality of electrical contacts which electrically interface to an interface unit of a host digital device. The flash memory module includes a plurality of flash memory cells. The cells are coupled for access under control of an integral controller. The integral indicator light is coupled under control of the integral controller. The integral indicator light indicates whether the flash memory module is being accessed. In a preferred embodiment, the flash memory module is formed of a light transmissive material. In a most preferred embodiment, the light transmissive material is a transparent plastic.

In most applications, the flash memory modules include a proximal end including the electrical contacts. The proximal end is inserted into the interface unit. The integral indicator light is preferably a surface mount LED. According to the preferred embodiment, the LED is positioned adjacent the distal end of the flash memory module to be seen through the transparent plastic from outside the interface unit.

In an alternate embodiment of the present invention, the integral controller generates a signal which is applied to at least one of the electrical contacts to advise the host digital device that the flash memory module is operating, regardless of whether the flash memory module is operating from an external reason, or for an internal reason, such as wear leveling.

In another alternate embodiment, the integral controller generates a signal to indicate that the flash module is close to the maximum limit of program-erase operations for at least a portion of the flash cells on the flash module. The user can use this signal as an indicator that the flash module needs to be replaced before additional write operations are implemented.

In yet another alternate embodiment, the integral controller generates a signal to indicate that the flash module is close to the maximum limit of spares which are available on the flash module. The user can use this signal as an indicator that the flash module needs to be replaced before additional program-erase operations are implemented. The signal for these alternate embodiments could be by illuminating a separate LED or by flashing the same LED recited above, but altering the cadence of the flashing where cadence means either changing the speed of the flashing or providing a predetermined sequence, e.g., flashing SOS in Morse Code.

DETAILED DESCRIPTION OF THE INVENTION

Figure 1:
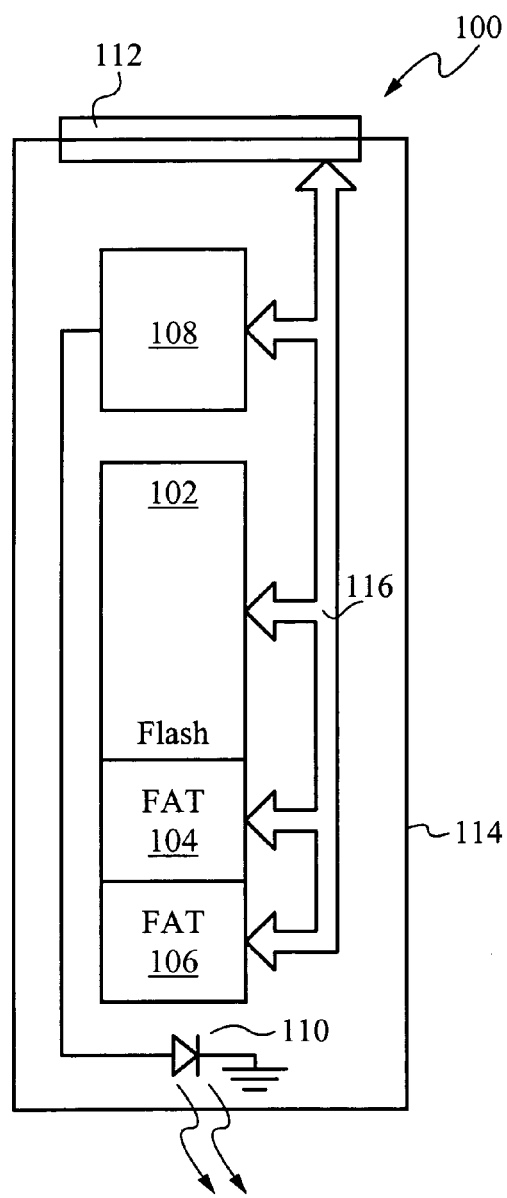
FIG. 1 shows a flash memory module of the preferred embodiment of the present invention.

FIG. 1 shows a flash memory module 100 according to the present invention. The flash memory module 100 includes an array of flash memory cells 102. A portion of the array is provided for storing the FAT tables 104 and 106. An integral controller 108 is configured to control the flash memory cells 102 and the FAT tables 104 and 106. The integral controller 108 is coupled to the flash memory cells 102 and the FAT tables 104 and 106 via a bus 116. The integral controller 108 also preferably performs memory maintenance operations, such as wear leveling activities or erasing replaced data to provide blocks for storing additional data. While the architecture of the flash memory module 100 is shown, this architecture is representative only and any conventional architecture for flash memory can be used according to the teachings of this invention.

An LED 110 is coupled under control of the integral controller 108. Whenever the flash memory module 100 is accessed for reading or programming, the LED 110 is lit by the integral controller 108. Likewise, when the integral controller 108 accesses the flash memory cells to perform internal memory maintenance operations, such as wear leveling or erasing replaced data the LED 110 is lit by the integral controller 108. Thus, when the flash memory module 100 is active, the operator is provided a definitive visual signal that the flash memory module 100 should not be removed.

As an alternate embodiment, the LED 110 can be configured to blink in a predetermined sequence whenever the flash memory module 100 is coupled to a host digital system. For example, the LED 110 can blink once every second. In this circumstance, when the flash memory module 100 is accessed or when the integral controller 108 is performing a memory maintenance operation, the LED 110 can be lighted continuously to indicate that the flash memory module 100 should not be removed.

As is well known, a portion of the flash memory cells 102 can be reserved as spares to replace defective cells as appropriate in the known way. The integral controller 108 is adapted to determine the number of available spares. When the number of spares falls to zero or below a predetermined threshold number, the cadence of the blinking of the LED 110 is altered. For example, the blinking can be slowed or speeded, or a predetermined sequence of blinking can be implemented. The change in the speed of blinking must be sufficient that a user can readily discern that the change occurred. For example, the blinking changes from once every second to once every three seconds. Alternatively, a sequence change in the blinking pattern can be implemented. For example, two quick blinks one-half second apart, followed by two seconds of the LED 110 being off. As another example, the LED 110 could be made to blink SOS in the Morse Code to signify that there is a potential problem with the flash memory module 100. When the user detects any of these changes in cadence, the user will know that the flash memory module 100 should be replaced to avoid a catastrophic system failure, loss of data or both.

Additionally, the integral controller 108 can count the number of program-erase cycles for the flash cells. The integral controller 108 can maintain the number of program-erase cycles in a register, and preferably in a flash memory register. When the number of program-erase cycles reaches a predetermined threshold, the integral controller 108 can alter the cadence of the blinking. The alteration of the blinking can be the same as described above for the circumstance that the number of spare blocks drops below a threshold, or it can be a different cadence.

Figure 3:
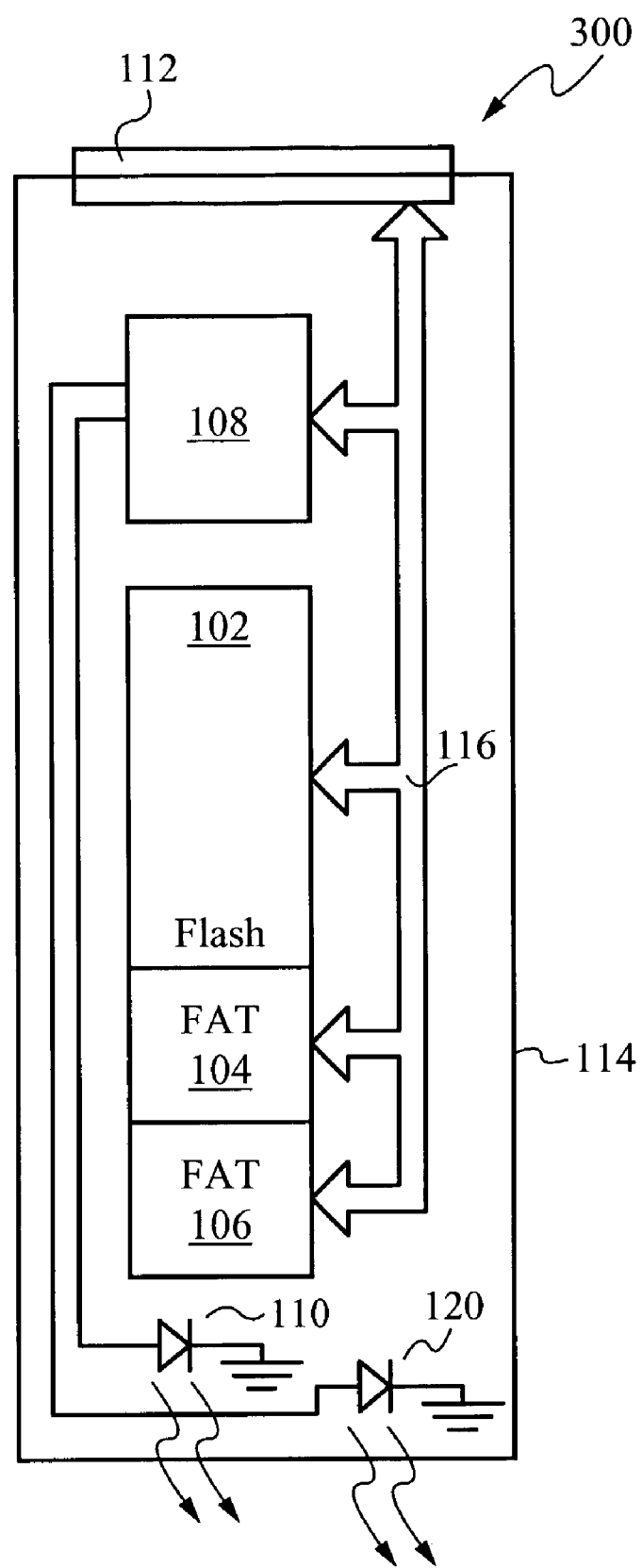
FIG. 3 shows a flash memory module of an alternate embodiment of the present invention.

As yet another embodiment, a second LED 120 can be included in the flash memory module 300 as shown in FIG. 3. Other than the additional LED 120, the flash memory module 300 is substantially the same as the flash memory module 100 of FIG. 1. The second LED 120 can be simply located at a predetermined physical distance from the LED 110. Alternatively, it can illuminate with a different frequency of light. For example, the LED 110 can shine red light while the LED 120 can shine green light. The LED 110 can be configured to light when the flash memory module 300 is engaged in a read operation, program-erase cycle or a memory maintenance operation. The second LED 120 can be configured to light when the integral controller 108 detects that the number of spares is below the predetermined threshold or the number of program-erase cycles exceeds that predetermined threshold.

According to the preferred embodiment, the flash memory module is formed on a printed circuit board using conventional techniques. At a proximal end of the printed circuit board includes exposed metallic regions that form the electrical contacts 112 for the flash memory module 100. At a distal end of the printed circuit board, the LED 110 is mounted. The flash memory module 100 is preferably encased within a transparent plastic housing 114. Alternatively, the LED could penetrate an opening through an opaque housing positioned to accept the LED. The proximal end of the flash memory module 100 is inserted into an interface unit of a host digital device (not shown). As is well known, the distal end of a conventional flash memory stick is visible while the flesh memory module is inserted into a digital device such as a laptop computer or PDA. In this way, when the LED 110 is lit by the integral controller 108 it can readily be seen by an operator through the transparent plastic material of the housing 114 or through an opening in the housing 114.

Figure 2:
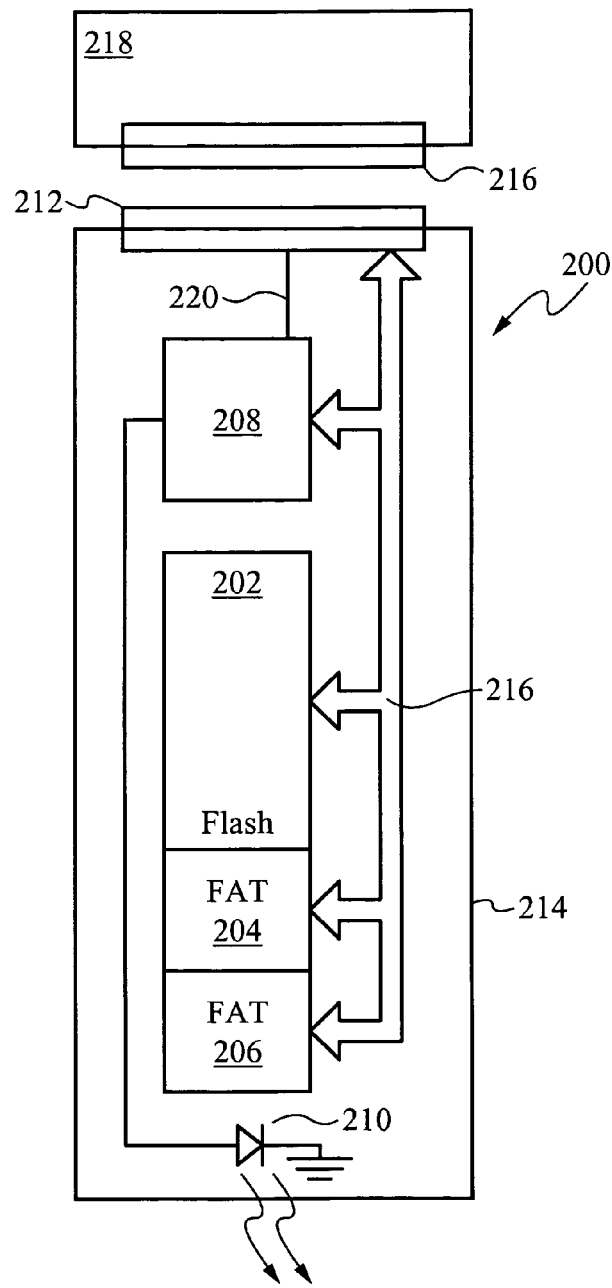
FIG. 2 shows a flash memory module of an alternate embodiment of the present invention.

FIG. 2 shows a flash memory module 200 according to an alternate embodiment of the present invention. The flash memory module 200 includes an array of flash memory cells 202. A portion of the array is provided for storing the FAT tables 204 and 206. An integral controller 208 is configured to control the flash memory and preferably to control wear leveling activities. While the architecture of the flash memory module 200 is shown, this architecture is representative only and any conventional architecture can be used according to the teachings of this invention.

An LED 210 is coupled under control of the integral controller 208. Whenever the flash memory module 200 is accessed for reading or programming, or for internal memory control operations, the LED 210 is lit by the integral controller 208. Thus, the operator is provided a definitive visual signal that the flash memory module 200 should not be removed.

According to this alternate embodiment, the flash memory module is formed on a printed circuit board using conventional techniques. At a proximal end of the printed circuit board includes exposed metallic regions that form the electrical contacts 212 for the flash memory module 200. At a distal end of the printed circuit board, the LED 210 is mounted. The flash memory module 200 is preferably encased within a transparent plastic housing 214. The proximal end of the flash memory module 200 is inserted into an interface unit 216 of a host digital device 218. In this way, when the LED 210 is lit by the integral controller 208 it can readily be seen by an operator through the transparent plastic material of the housing 214.

The alternate embodiment of FIG. 2 also includes a signal line 220 which is coupled from the integral controller 208 to the electrical contacts 212, and hence to the host digital device 218. The signal line 220 is used to communicate to the host digital device 218 when the flash memory module 200 is operatively using the flash memory 202 or the FAT tables 204 and 206 and thus, unable of successfully being accessed by the host digital device 218.

Figure 4:
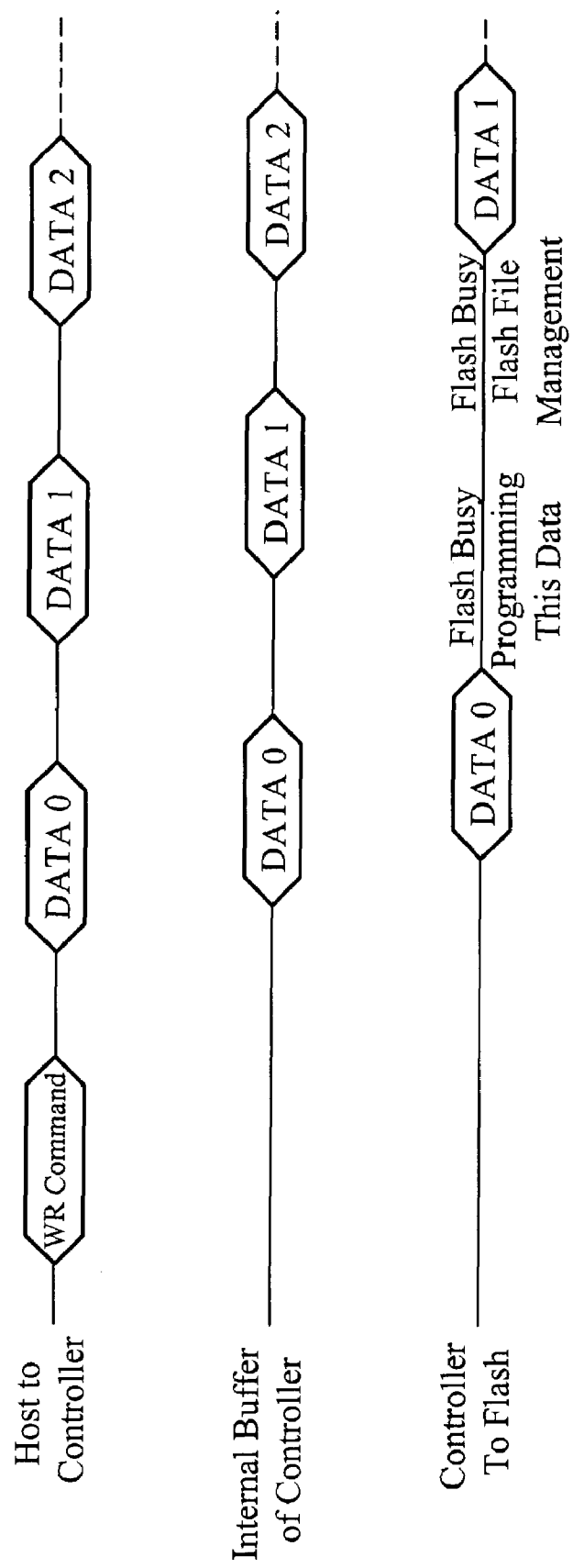
FIG. 4 shows a timing diagram of a operation of a flash module according to the present invention.

FIG. 4 shows a timing diagram of the operation of a flash module according to the present invention. A host system is operated to transfer data from the host system to a flash memory module. An example of such a transfer could be taking a photograph using a digital camera. In this example, the digital camera is the host system and the flash module can be a memory stick, such as available from Lexar Media, Inc. of Fremont, Calif. In such a transfer of data, the data can be a stream of bit, bytes, packets or other well known collections of data. Though not intended to be limiting, this example refers to a transfer of a stream of packets, DATA 0, DATA 1, DATA 2, and the stream will continue until the entire file is written.

A write command WR Command is communicated from a host system to a controller circuit on a flash module. At a predetermined time, a first packet DATA 0 is transferred from the host system to the flash module. The first packet DATA 0 is then written by the controller onto an internal buffer of the controller on the flash module. Thereafter, the controller transfers the first packet DATA 0 from the internal buffer and programs the first packet DATA 0 into the flash memory. In this example, while the first packet DATA 0 is transferred, the controller is not engaged in any other programming operation to the flash memory nor engaged in an internal memory access operation. As such the transfer of the first packet DATA 0 proceeds promptly.

The host system then promptly transfers the second packet DATA 1 to the flash module. The second packet DATA 1 is then written by the controller onto the internal buffer of the controller on the flash module. In this example, the controller is first engaged in programming the first packet DATA 0 into the flash and then the controller is engaged in an internal memory access operation, such as flash file management for a particular block with the flash memory. As shown in the drawing of FIG. 4, the operation of programming the second packet DATA 1 is delayed until the controller completes the flash file management operation. The controller does not communicate to the host system that it is involved in the flash file management operation, and so the third packet DATA 2 is transferred to the flash module. As such the programming of the second packet DATA 1 into the flash is delayed which likely will cause a delay in the programming of the third packet DATA 2.

In a circumstance such as that described in this example for the programming to the flash of the second packet DATA 1, the host system continues to transfer packets to the internal buffer of the controller on the flash module. When the host system concludes its transfer, it can signal the user that it is safe to remove the flash module even though the programming of packets continues. However, because of the present invention, the user receives an indicator that the flash is in use and cannot be removed. In this way, the indicator of the present invention prevents the corruption of data programmed in the flash memory.

This invention is described according to specific preferred embodiments. It will be apparent that other embodiments are possible and still fall within the teachings of this invention. For example, other architectures for the flash memory module are possible. Further, the LED could be mounted to provide its visual signal through an aperture in the housing to the flash memory module. Also, the electrical contacts on the flash memory module could be implemented using pins mounted to the printed circuit board. Likewise, the indicator could be other than a visual indicator, such as an audible indicator. Furthermore, the architecture of FIG. 3 could also include a signal line such as that of FIG. 2 for communicating to the host digital system that the flash memory module is in use.

What is claimed is:

1. A flash memory module including:
  a. a plurality of flash cells;
  b. a controller, operatively coupled to the flash cells; and
  c. a single LED, operatively coupled to the controller for providing an in-use signal which is perceivable by a user whether the flash memory module is active, including performing internal maintenance operations, wherein the LED is further coupled to a signal from the controller that causes the LED to blink in a first cadence to provide the in-use signal and to blink in a second cadence to provide a replacement signal.

2. The flash memory module according to claim 1, wherein the LED is further coupled to a signal from the controller that indicates that the controller has counted a threshold number of program-erase cycles of the plurality of flash cells and that the LED is to blink in a predetermined pattern.

3. The flash memory module according to claim 2, further comprising a housing, wherein the housing is transparent to light and further wherein the LED is mounted within the housing.

4. The flash memory module according to claim 1, further comprising electrical contacts, in electrical communication with the controller.

5. The flash memory module according to claim 4, further comprising an electronic signal coupled to the electrical contacts for indicating to a host digital device whether the flash memory module is active, including performing internal memory operations.

6. The flash memory module according to claim 1, wherein the LED is continuously lighted for the in-use signal and the LED is blinking according to a predetermined cadence for the replacement signal.

7. A flash memory module according to claim 1, in which the controller is an integrated controller.

8. A removable memory device comprising:
a. a housing;
b. a plurality of flash memory cells mounted within the housing;
c. a controller, operatively coupled to the flash memory cells and also mounted within the housing;
d. a single LED, operatively coupled to the plurality of flash memory cells and to the controller for indicating that the removable device is in use, including during internal memory operations, the LED further indicating that the controller has counted a maximum quantity of program-erase cycles of the plurality of flash memory cells; and
e. an electrical connector mounted to the housing and operatively coupled to the plurality of flash memory cells and the controller for coupling the removable flash memory device to the external system.

9. The removable memory device according to claim 8, in which the controller is an integrated controller.

* * * * *